US011011422B2

(12) United States Patent
Basker (10) Patent No.: US 11,011,422 B2
(45) Date of Patent: May 18, 2021

(54) SELF-ALIGNED WRAP-AROUND TRENCH CONTACTS

(71) Applicant: INTERNATIONAL BUSINESS MACHINES CORPORATION, Armonk, NY (US)

(72) Inventor: Veeraraghavan S. Basker, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/157,833

(22) Filed: Oct. 11, 2018

(65) Prior Publication Data

US 2020/0118874 A1 Apr. 16, 2020

(51) Int. Cl.
*H01L 21/768* (2006.01)
*H01L 21/02* (2006.01)
*H01L 21/28* (2006.01)
*H01L 21/311* (2006.01)
*H01L 29/66* (2006.01)
*H01L 29/78* (2006.01)
*H01L 23/535* (2006.01)

(52) U.S. Cl.
CPC .. *H01L 21/76897* (2013.01); *H01L 21/76805* (2013.01); *H01L 21/76843* (2013.01); *H01L 21/76895* (2013.01); *H01L 23/535* (2013.01); *H01L 29/66795* (2013.01); *H01L 29/7851* (2013.01); *H01L 2029/7858* (2013.01)

(58) Field of Classification Search
CPC ............... H01L 29/6653; H01L 21/76897
See application file for complete search history.

(56) References Cited

U.S. PATENT DOCUMENTS

| | | | |
|---|---|---|---|
| 8,362,574 B2 | 1/2013 | Kawasaki et al. | |
| 9,147,765 B2 | 9/2015 | Xie et al. | |
| 9,379,025 B1 | 6/2016 | Basker et al. | |
| 9,484,348 B2 | 11/2016 | Basker et al. | |
| 9,680,020 B2 | 6/2017 | Basker et al. | |
| 9,722,043 B2 | 8/2017 | Basker et al. | |
| 9,805,983 B1 | 10/2017 | Cheng et al. | |
| 9,847,390 B1 | 12/2017 | Xie et al. | |
| 2009/0236656 A1* | 9/2009 | Sung | H01L 27/10876 257/329 |
| 2014/0159159 A1* | 6/2014 | Steigerwald | H01L 21/76897 257/369 |
| 2015/0214331 A1 | 7/2015 | Jang et al. | |
| 2017/0012129 A1* | 1/2017 | Basker | H01L 29/7851 |
| 2017/0054004 A1* | 2/2017 | Cheng | H01L 29/66553 |
| 2017/0076954 A1* | 3/2017 | Seo | H01L 27/0886 |
| 2017/0352662 A1* | 12/2017 | Xu | H01L 29/66803 |

(Continued)

*Primary Examiner* — Omar F Mojaddedi
(74) *Attorney, Agent, or Firm* — Tutunjian & Bitetto, P.C.; Douglas Pearson (57) ABSTRACT

Semiconductor devices and methods of forming the same include forming a gate stack over a semiconductor fin. An interlayer dielectric is formed to a height of the gate stack. The interlayer dielectric is etched away in regions outside of junction regions for the semiconductor fin to form first gaps. A dielectric cap is formed over the gate stack and in the first gaps. The remaining interlayer dielectric is etched away to expose a source and drain region of the semiconductor fin. A conductive junction is formed on the semiconductor fin.

8 Claims, 7 Drawing Sheets

(56) References Cited

U.S. PATENT DOCUMENTS

2018/0012887 A1\* 1/2018 Labonte ................ H01L 29/785
2018/0090582 A1 3/2018 Adusumilli et al.
2018/0308753 A1\* 10/2018 Mosden ............ H01L 29/66545
2019/0172941 A1\* 6/2019 Rachmady ............ H01L 29/775

\* cited by examiner

FIG. 12

SELF-ALIGNED WRAP-AROUND TRENCH CONTACTS

BACKGROUND

Technical Field

The present invention generally relates to semiconductor device fabrication and, more particularly, to the formation of self-aligned, wrap-around trench contacts without damaging the gate and other structures.

Description of the Related Art

Existing transistor fabrication processes are self-aligned in the direction parallel to the devices' gates, but there is no self-alignment in the direction perpendicular to the devices' gates. As a result, short-circuits occur between adjacent source/drain contacts and between those contacts and device gates. Additionally, forming wrap-around contacts to the source/drain regions of such devices is challenging, as the etch that uncovers the source/drain regions can also etch the gate's dielectric cap, creating a risk of exposing the gate to other contact levels.

SUMMARY

A method of forming a semiconductor device includes forming a gate stack over a semiconductor fin. An interlayer dielectric is formed to a height of the gate stack. The interlayer dielectric is etched away in regions outside of junction regions for the semiconductor fin to form first gaps. A dielectric cap is formed over the gate stack and in the first gaps. The remaining interlayer dielectric is etched away to expose a source and drain region of the semiconductor fin. A conductive junction is formed on the semiconductor fin.

A method of forming a semiconductor device includes forming a gate stack over a semiconductor fin. A silicon dioxide layer is formed to a height of the gate stack. The silicon dioxide layer is etched away in regions outside of junction regions for the semiconductor fin to form first gaps. The gate stack is recessed relative to the silicon dioxide layer. A silicon nitride cap is formed over the gate stack and in the first gaps. The remaining silicon dioxide layer is etched away to expose a source and drain region of the semiconductor fin. A wrap-around conductive junction is formed that contacts three sides of the semiconductor fin.

An integrated chip includes a semiconductor device and a passivating layer formed in a field region surrounding the semiconductor device. The semiconductor device includes a gate stack formed over a channel region of a semiconductor structure. A conductive junction is formed on each of a source and drain region of the semiconductor structure. A dielectric cap is formed from a first dielectric material formed around the gate stack, between the gate stack and the conductive junction. A passivating layer is formed from a second dielectric material in a field region surrounding the semiconductor device.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention define the dimensions of junctions for transistors using a dielectric cap that is distinct from a passivating dielectric used in non-device regions. The present embodiments thereby prevent the removal of the cap material when exposing the junctions for the transistor before forming conductive contacts. This provides wrap-around junctions that contact multiple sides of the junctions to reduce contact resistance. Additionally, the use of the dielectric cap helps fabricate these structures in a self-aligned fashion, preventing accidental short-circuits to other structures.

Figure 1:
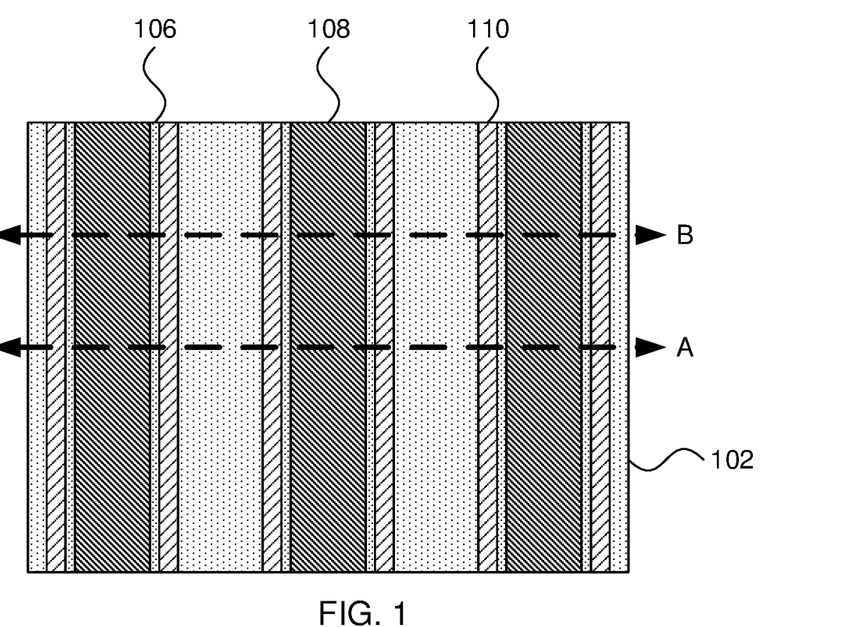
FIG. 1 is a diagram of the formation of a semiconductor device with self-aligned, wrap-around source/drain junctions that shows a top-down view of gate stacks separated by an interlayer dielectric in accordance with an embodiment of the present invention.

Referring now to the drawings in which like numerals represent the same or similar elements and initially to FIG. 1, a top-down view of a step in the formation of junctions in a semiconductor device is shown. The top-down view also illustrates two cross-sectional planes that will be employed in the following drawings. In particular, cross-sectional plane A cuts parallel to an underlying semiconductor fin (not shown) in a region where the semiconductor fin is present, while cross-sectional plane B cuts parallel to the semiconductor fin in a region where the fin is not present.

A gate conductor 108 is shown, with a gate dielectric and a gate spacer 110, forming parallel gate structures. A work function metal (not shown) may optionally be included to tune the electronic properties of the final device including, e.g., threshold voltage. These gate structures are formed by any appropriate process including, for example, a replacement metal gate process or photolithography. It is specifically contemplated that the gate spacers 110 may be formed first around a dummy gate structure which is then etched away. The gate dielectric 106 is formed on surfaces within the space left by the removal of the dummy gate structure and the gate conductor 108 is formed to fill the remainder of the space. The inter-layer dielectric 102 is deposited over and around the gate structures and is then polished down to the level of the gate structures, exposing the top surfaces of the gate conductors 108. It should be noted that the region outside the device region is known as the field region, which may be formed having a planarizing dielectric such as, e.g., silicon dioxide.

Figure 2:
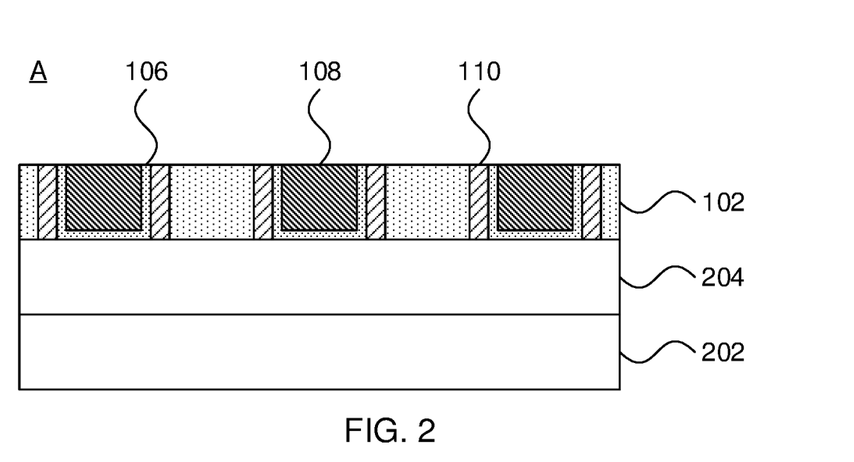
FIG. 2 is a cross-sectional diagram of the formation of a semiconductor device with self-aligned, wrap-around source/drain junctions in a region aligned with a semiconductor fin that shows the gate stacks and interlayer dielectric over the semiconductor fin in accordance with an embodiment of the present invention.

Referring now to FIG. 2, a cross-sectional view along plane A of a step in the formation of junctions in a semiconductor device is shown. This view shows the semiconductor substrate 202 and semiconductor fin 204. It should be understood that the present embodiments are specifically described with respect to a fin-based device structure. However, alternative embodiments may be fabricated in the form of a planar device, where the channel of a transistor is formed in the same plane as the substrate.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

The semiconductor fin 204 may be formed from the same material as the semiconductor substrate 102 or may, alternatively be formed from an alternative material. The semiconductor fin 204 may be formed by a lithographic patterning process, such as a reactive ion etch (RIE) that creates a mask on the substrate and etches down, removing material to leave the semiconductor fin 204. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation. Alternatively, the fin structure 204 can be formed by spacer imaging transfer.

The gate structures are formed perpendicularly across the fin 204. Thus, in regions without the fin 204, the gate structures will extend down to contact the substrate 202. The cross-sectional view shows that the gate dielectric 106 is conformally formed on the sidewalls of the spacers 110 and the top surface of the underlying semiconductor material.

The gate dielectric 106 can be formed from any appropriate dielectric including, e.g., a high-k dielectric. A high-k dielectric is a material that has a dielectric constant k that is higher than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor 108 can be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 108 can alternatively be formed from a doped semiconductor material such as, e.g., doped polysilicon.

The gate spacers 110 are formed by any appropriate dielectric material such as, for example, silicon nitride. The inter-layer dielectric 102, meanwhile, is formed from a material having etch selectivity with respect to the gate spacers 110. As used herein, the term "selective" in reference to a material removal process denotes that the rate of material removal for a first material is greater than the rate of removal for at least another material of the structure to which the material removal process is being applied. Thus, the selectively etchable materials of the gate spacers 110 and the inter-layer dielectric 102 make it possible to remove material from the inter-layer dielectric without substantially damaging the gate spacers 110.

Figure 3:
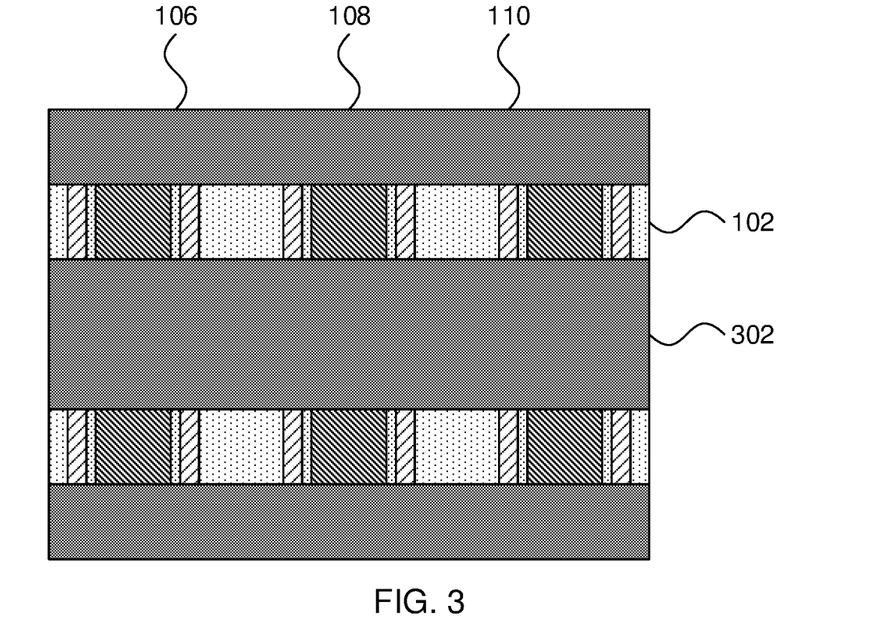
FIG. 3 is a diagram of the formation of a semiconductor device with self-aligned, wrap-around source/drain junctions that shows a top-down view of a mask layer that covers an area above the semiconductor fin in accordance with an embodiment of the present invention.

Referring now to FIG. 3, a top-down view of a step in the formation of junctions in a semiconductor device is shown. A mask 302 is formed on top of the gate structures and the inter-layer dielectric. The mask 302 is etched to expose strips perpendicular to the gate structures. The mask 302 may be formed by any appropriate process including photolithography. Thus the mask 302 may be formed from any appropriate material, including a photoresist. A mask pattern is produced by applying a photoresist to the surface to be etched. The photoresist is exposed to a pattern of radiation. The pattern is then developed into the photoresist utilizing a resist developer. Once the patterning of the photoresist is completed, the sections covered by the photoresist are protected from subsequent etch steps.

Figure 4:
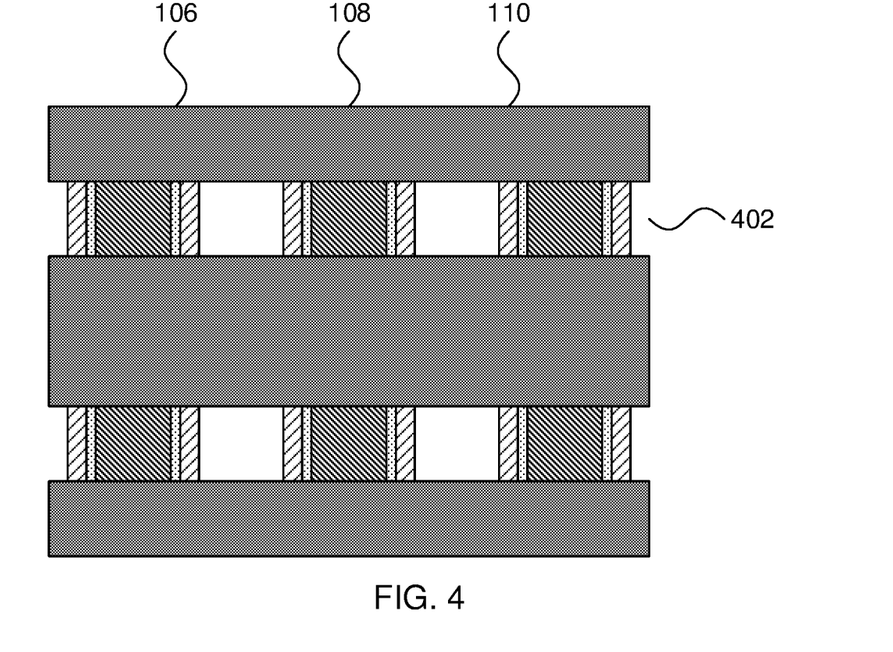
FIG. 4 is a diagram of the formation of a semiconductor device with self-aligned, wrap-around source/drain junctions that shows a top-down view of the removal of exposed portions of the interlayer dielectric in accordance with an embodiment of the present invention.

Referring now to FIG. 4, a top-down view of a step in the formation of junctions in a semiconductor device is shown. The exposed portions of the inter-layer dielectric 102 are etched away using any appropriate anisotropic etch such as, e.g., a selective RIE that removes the material of the inter-layer dielectric without substantially harming the mask 302 or the materials of the gate structures. The etch exposes gaps 402 between the gate structures.

Figure 5:
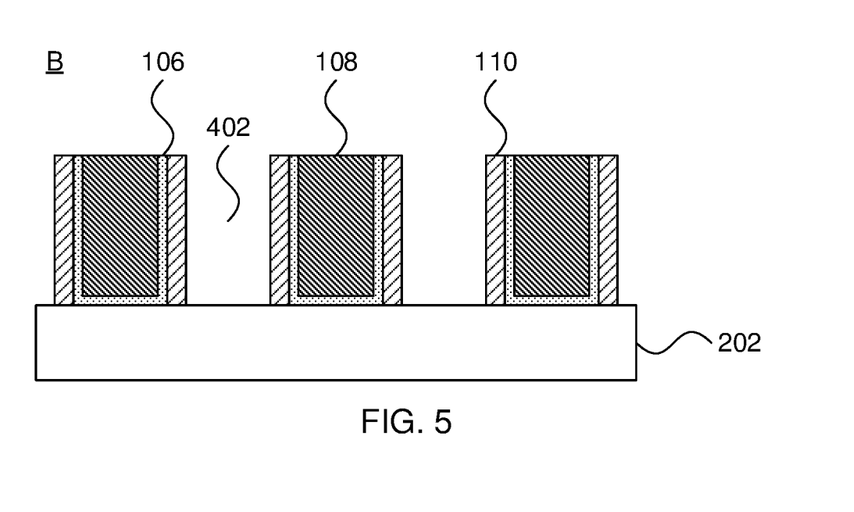
FIG. 5 is a cross-sectional diagram of the formation of a semiconductor device with self-aligned, wrap-around source/drain junctions in a region aligned with a semiconductor fin that shows the removal of the exposed portions of the interlayer dielectric in accordance with an embodiment of the present invention.

Referring now to FIG. 5, a cross-sectional view along plane B of a step in the formation of junctions in a semiconductor device is shown. The gaps 402 are shown, penetrating down to expose the top surface of the semiconductor substrate 202. The mask 302 is etched away, exposing the top surface of the gate structures.

Figure 6:
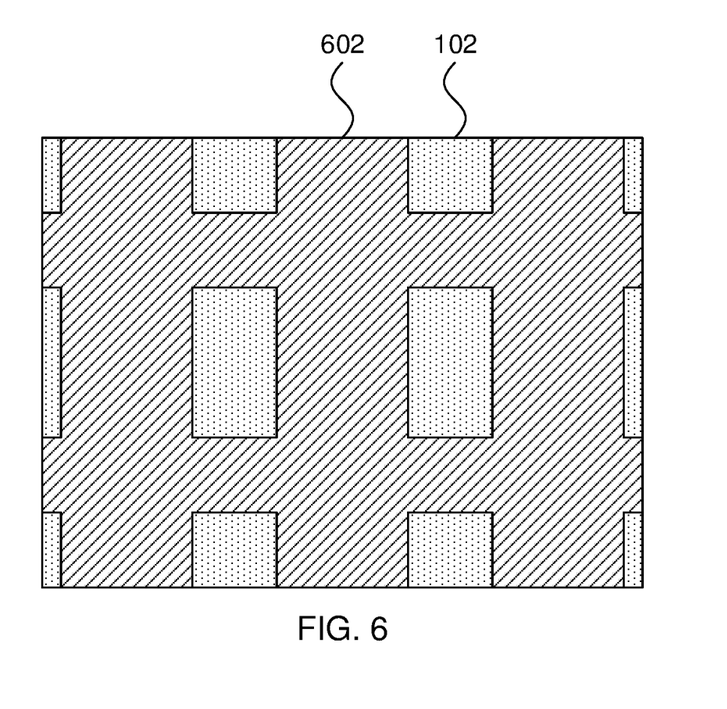
FIG. 6 is a diagram of the formation of a semiconductor device with self-aligned, wrap-around source/drain junctions that shows a top-down view of the formation of a dielectric cap over the gate stack in accordance with an embodiment of the present invention.

Referring now to FIG. 6, a top-down view of a step in the formation of junctions in a semiconductor device is shown. The gate structures are recessed below the height of the remaining interlayer dielectric 102 and a cap layer 602 is formed over the gate structures and in the gaps 402, filling the gaps 402. It is specifically contemplated that the cap layer 602 may be formed from silicon nitride, but it should be understood that any appropriate dielectric material may be used that is selective with respect to the interlayer dielectric 102. Any appropriate deposition process may be used including, for example, chemical vapor deposition (CVD), atomic layer deposition (ALD), physical vapor deposition (PVD), or gas cluster ion beam (GCIB) deposition. Any cap material that rises above the top level of the remaining interlayer dielectric 102 is polished away in, for example, a chemical mechanical planarization (CMP) process that stops on the material of the interlayer dielectric 102.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

CMP is performed using, e.g., a chemical or granular slurry and mechanical force to gradually remove upper layers of the device. The slurry may be formulated to be unable to dissolve, for example, the interlayer dielectric material, resulting in the CMP process's inability to proceed any farther than that layer.

Figure 7:
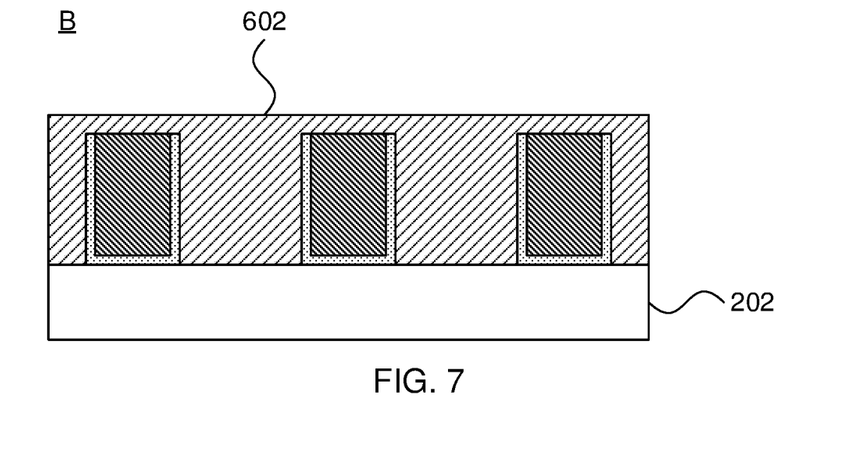
FIG. 7 is a cross-sectional diagram of the formation of a semiconductor device with self-aligned, wrap-around source/drain junctions in a region aligned with a semiconductor fin that shows the formation of a dielectric cap over the gate stack in accordance with an embodiment of the present invention.

Referring now to FIG. 7, a cross-sectional view along plane B of a step in the formation of junctions in a semiconductor device is shown. The cap 602 is shown between the gate structures. The gate structures have been recessed below the height of the remaining interlayer dielectric 102, such that the cap 602 covers the gate structures. It is specifically contemplated that the gate structures can be recessed using an isotropic wet or dry etch process, and the depth may be controlled by timing the etch. In some embodiments, the gate structures may be recessed to a depth of about 60 nm.

Figure 8:
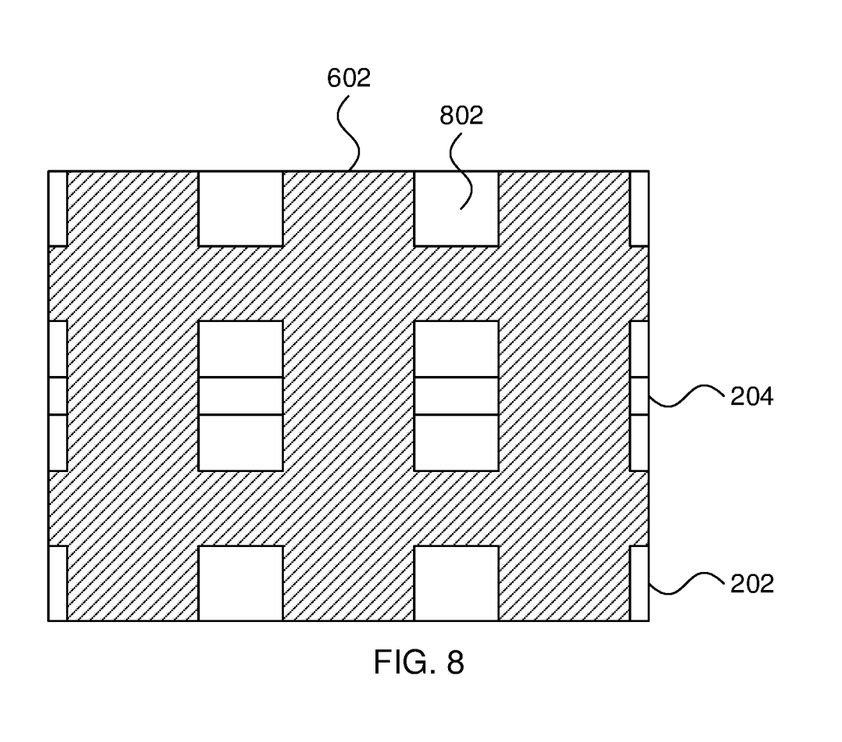
FIG. 8 is a diagram of the formation of a semiconductor device with self-aligned, wrap-around source/drain junctions that shows the removal of remaining portions of the interlayer dielectric in accordance with an embodiment of the present invention.

Referring now to FIG. 8, a top-down view of a step in the formation of junctions in a semiconductor device is shown. The remaining interlayer dielectric 102 is etched away with a selective etch. Any appropriate selective etch may be used including, for example, an anisotropic RIE or an isotropic wet or dry chemical etch. The interlayer dielectric 102 is removed without damaging the cap 602. The underlying regions of the semiconductor fin 204 and the semiconductor substrate 202 is exposed in the gaps 802.

Figure 9:
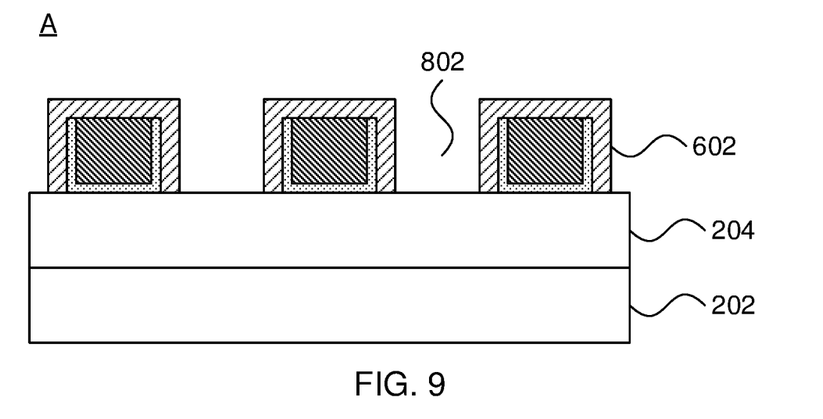
FIG. 9 is a cross-sectional diagram of the formation of a semiconductor device with self-aligned, wrap-around source/drain junctions in a region aligned with a semiconductor fin that shows the removal of remaining portions of the interlayer dielectric in accordance with an embodiment of the present invention.

Referring now to FIG. 9, a cross-sectional view along plane A of a step in the formation of junctions in a semiconductor device is shown. The gaps 802 are shown exposing the semiconductor fin 204 in junction regions. The semiconductor fin 204 is thus separated into channel regions, which are covered by the gate structures and the cap 602, and source/drain regions. The etch exposes sidewalls of the semiconductor fin 204.

Figure 10:
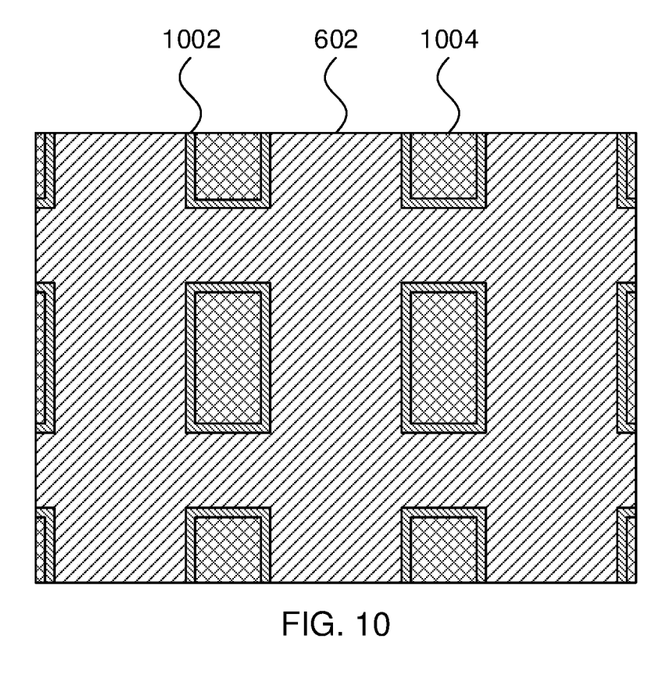
FIG. 10 is a diagram of the formation of a semiconductor device with self-aligned, wrap-around source/drain junctions that shows the formation of wrap-around source/drain junctions in accordance with an embodiment of the present invention.

Referring now to FIG. 10, a top-down view of a step in the formation of junctions in a semiconductor device is shown. Junction contacts are formed in the gaps 802 by, for example, depositing a liner 1002 and a fill metal 1004. Because the sidewalls of the semiconductor fin 204 are exposed, the junction contacts have a wrap-around structure that contacts three sides of the semiconductor fin 204. This wrap-around structure improves the electrical connection and decreases the junction resistance of the device.

The liner 1002 may be formed from any appropriate conductive material that forms good adhesion between the semiconductor material of the semiconductor fin 204 and the fill metal 1004, such as titanium or titanium nitride. The fill metal 1004 may be formed from any appropriate conductive metal such as, e.g., tungsten, nickel, titanium, molybdenum, tantalum, copper, platinum, silver, gold, ruthenium, iridium, rhenium, rhodium, and alloys thereof.

The liner 1002 may be formed by any conformal deposition process such as, e.g., CVD or ALD, and the fill metal 1004 may similarly be formed by any appropriate deposition process to fill in the remainder of the gap 802. The deposition is followed by a CMP that stops on the cap 602. In the final structure, the passivating dielectric in the device region is indicated by cap 602, while the passivating dielectric in the field region stands as a different material, such as silicon dioxide. It is contemplated that the field region may be protected from the oxide etch described above by an appropriate mask structure.

Figure 11:
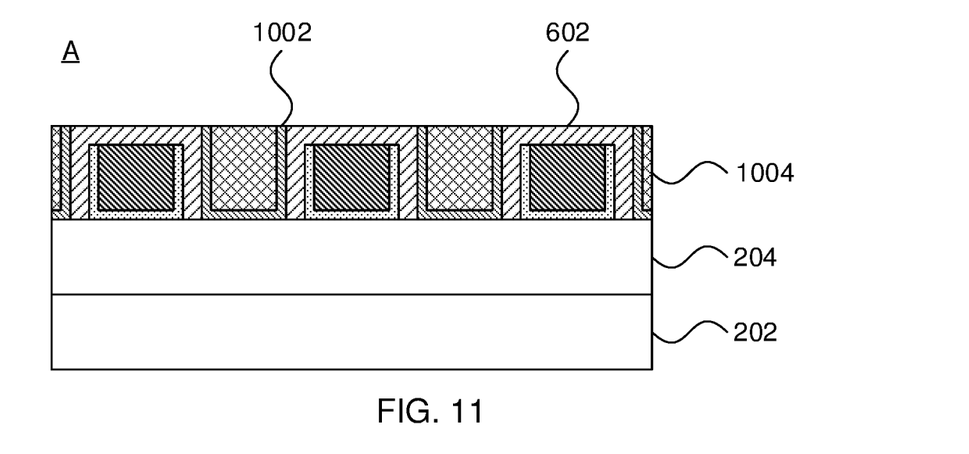
FIG. 11 is a cross-sectional diagram of the formation of a semiconductor device with self-aligned, wrap-around source/drain junctions in a region aligned with a semiconductor fin that shows the formation of wrap-around source/drain junctions in accordance with an embodiment of the present invention.

Referring now to FIG. 11, a cross-sectional view along plane A of a step in the formation of junctions in a semiconductor device is shown. The junction contacts are shown alongside the gate structures. At this point, vias can be formed through the caps 602 to expose the top surface of the gate contacts 108. Conductive contacts can then be formed to the junction fill metal 1004 and to the gate contacts 108 to finish the device.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood at yen a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
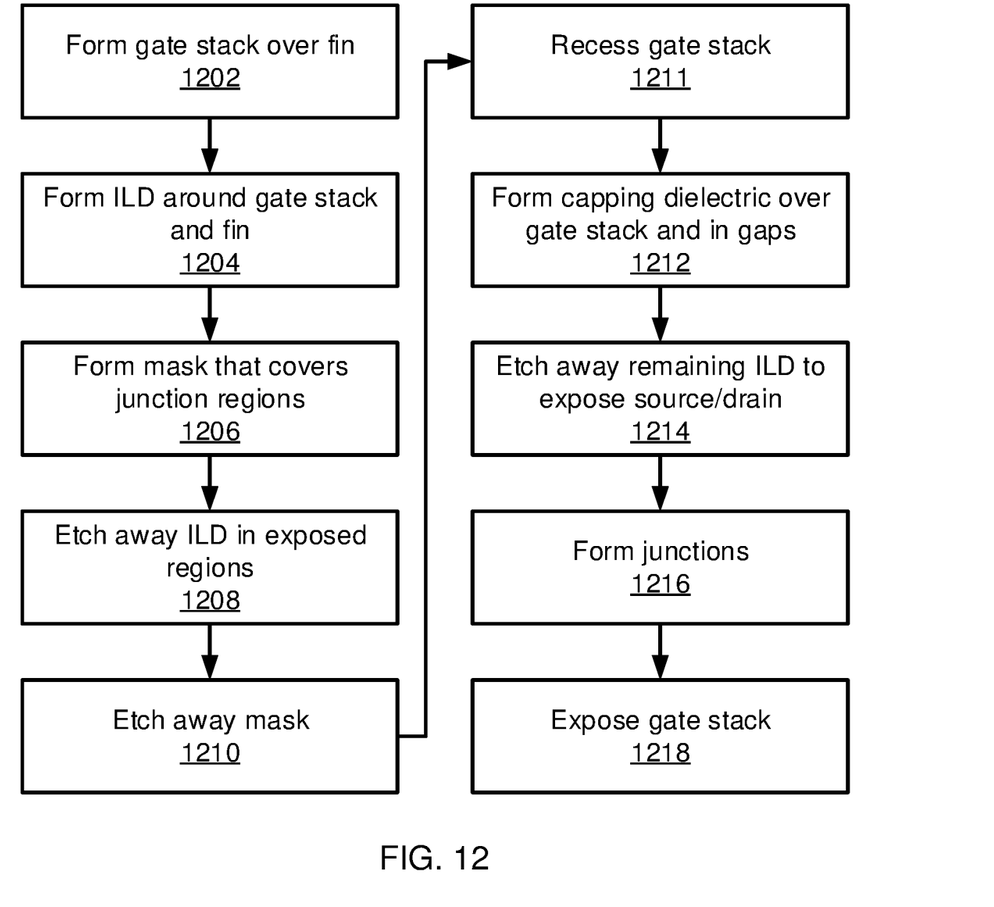
FIG. 12 is a block/flow diagram of a process for forming a semiconductor device having self-aligned, wrap-around source/drain junctions in accordance with an embodiment of the present invention.

Referring now to FIG. 12, a method of forming self-aligned, wrap-around trench contacts in a semiconductor device is shown. Block 1202 forms a gate stack over a semiconductor fin 204 and block 1204 forms an interlayer dielectric 102 around the gate stack and the fin 204. Block 1206 forms a mask 302 that covers the junction regions of the interlayer dielectric 102, particularly the regions over the junction regions of the semiconductor fin 204. The mask 302 may be formed photolithographically.

Block 1208 etches away the interlayer dielectric material that is exposed by the mask 302, revealing bare semiconductor substrate 202 underneath and a gap 402 between the gate structures. The etch is performed with an anisotropic, selective etch such as an RIE that removes the exposed material of the interlayer dielectric without damaging the gate structures. Block 1210 then etches away the mask 302 to expose the gate structures.

Block 1211 recess the gate stack relative to the remaining interlayer dielectric 102. Block 1212 forms a dielectric cap 602 over the recessed gate stack and in the gaps 402, polishing the dielectric material down to the same height as the remaining interlayer dielectric 102. Block 1214 etches away the remaining interlayer dielectric using an appropriate selective etch that removes the material from the interlayer dielectric 102 without substantially damaging the cap 602. This etch opens gaps 802, exposing the underlying semiconductor substrate 202 and the semiconductor fin 204.

Block 1216 forms wrap around junctions on the exposed source and drain regions of semiconductor fin 204. The junctions may include, for example, a conformally formed liner layer 1002 and a fill metal 1004, polished down to the height of the dielectric cap 602. Block 1218 forms openings in the dielectric cap 602 to expose the underlying gate stack, in particular the gate conductor 108. The device can then be completed by forming electrical contacts to the gate conductor 108 and to the junctions.

Having described preferred embodiments of self-aligned wrap around trench contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
    forming a gate stack over a semiconductor fin;
    forming an interlayer dielectric to a height of the gate stack;
    etching away the interlayer dielectric in regions outside of junction regions for the semiconductor fin to form first gaps;
    recessing the gate stack relative to a height of a top surface of the interlayer dielectric;
    forming a dielectric cap over the gate stack and in the first gaps after recessing the gate stack;
    etching away the remaining interlayer dielectric to expose a source and drain region of the semiconductor fin; and
    forming a conductive junction on the semiconductor fin.

2. The method of claim 1, wherein the conductive junction is a wrap-around junction that contacts three sides of the semiconductor fin.

3. The method of claim 1, wherein forming the dielectric cap comprises:
    depositing a dielectric cap material to fill the first gaps and to cover the gate stack and the interlayer dielectric; and
    polishing the dielectric cap material down to expose the interlayer dielectric.

4. The method of claim 1, wherein the interlayer dielectric and the dielectric cap are formed from different dielectric materials.

5. The method of claim 4, wherein the interlayer dielectric is formed from silicon dioxide and the dielectric cap is formed from silicon nitride.

6. The method of claim 1, further comprising etching the dielectric cap to expose a top surface of the gate stack.

7. The method of claim 1, wherein forming the conductive junction comprises depositing a conductive liner and a fill metal.

8. The method of claim 1, wherein etching away the interlayer dielectric in regions outside of junction regions comprises:
    forming a mask that covers the junction regions and the gate stack;
    anisotropically etching away interlayer dielectric material exposed by the mask; and
    etching away the mask to expose the remaining interlayer dielectric material and the gate stack.

* * * * *